(12) United States Patent
Goh et al.

(10) Patent No.: US 11,133,261 B2
(45) Date of Patent: Sep. 28, 2021

(54) ELECTRONIC DEVICE PACKAGING (71) Applicant: Intel Corporation, Santa Clara, CA (US)

(72) Inventors: Eng Huat Goh, Penang (MY); Min Suet Lim, Simpang Ampat (MY); Chee Kheong Yoon, Bayan Lepas (MY); Jia Yan Go, Kulim (MY)

(73) Assignee: Intel Corporation, Santa Clara, CA (US)

( * ) Notice: Subject to any disclaimer, the term of this patent is extended or adjusted under 35 U.S.C. 154(b) by 255 days.

(21) Appl. No.: 15/845,336

(22) Filed: Dec. 18, 2017

(65) Prior Publication Data
US 2019/0103358 A1 Apr. 4, 2019

(30) Foreign Application Priority Data

Sep. 29, 2017 (MY) .......................... PI 2017703699

(51) Int. Cl.
*H01L 23/538* (2006.01)
*H01L 25/10* (2006.01)
(Continued)

(52) U.S. Cl.
CPC ........ *H01L 23/5385* (2013.01); *H01L 25/105* (2013.01); *H01L 25/50* (2013.01);
(Continued)

(58) Field of Classification Search
CPC ... H01L 23/5385; H01L 25/105; H01L 25/50; H01L 2924/15311; H01L 2224/16225; H01L 2225/1023; H01L 2224/48091; H01L 2225/1058; H01L 2924/181; H01L 2224/73204; H01L 23/3121; H01L 25/18; H01L 23/18; H01L 25/0657; H01L 2225/0651; H01L 2225/0652; H01L 23/49816; H05K 1/181; H05K 2201/10378; H05K 2201/10734
See application file for complete search history.

(56) References Cited

U.S. PATENT DOCUMENTS 6,900,528 B2 * 5/2005 Mess .................. H01L 23/3128
257/686
2001/0015485 A1 * 8/2001 Song .................... H01L 23/055
257/679

(Continued)

*Primary Examiner* — Benjamin Tzu-Hung Liu
(74) *Attorney, Agent, or Firm* — Schwegman Lundberg & Woessner, P.A.

(57) ABSTRACT

An electronic device may be a first package. The first package may include a first substrate having a first mounting surface. A first die may be coupled to the first mounting surface. A first interconnect region may be laterally spaced from the first die. The first package may be interconnected with a second package. The second package may include a second die coupled to a second mounting surface. Interconnection of the first package with the second package may establish one or more electrical communication pathways between the first package and the second package. The interconnection of the first package with the second package may interconnect the first die with the second die such that the first die and second die are in communication only through the one or more electrical communication pathways.

12 Claims, 5 Drawing Sheets

(51) Int. Cl.
*H05K 1/18* (2006.01)
*H01L 25/00* (2006.01)
*H01L 25/18* (2006.01)
*H01L 23/18* (2006.01)
*H01L 25/065* (2006.01)
*H01L 23/498* (2006.01)
*H01L 23/31* (2006.01)

(52) U.S. Cl.
CPC .............. *H05K 1/181* (2013.01); *H01L 23/18* (2013.01); *H01L 23/3121* (2013.01); *H01L 23/49816* (2013.01); *H01L 25/0657* (2013.01); *H01L 25/18* (2013.01); *H01L 2224/16225* (2013.01); *H01L 2224/48091* (2013.01); *H01L 2224/73204* (2013.01); *H01L 2225/0651* (2013.01); *H01L 2225/0652* (2013.01); *H01L 2225/1023* (2013.01); *H01L 2225/1058* (2013.01); *H01L 2924/15311* (2013.01); *H01L 2924/181* (2013.01); *H05K 2201/10378* (2013.01); *H05K 2201/10734* (2013.01)

(56) References Cited

U.S. PATENT DOCUMENTS

| | | | |
|---|---|---|---|
| 2006/0043568 A1* | 3/2006 | Abe | H01L 21/4857 257/698 |
| 2015/0221614 A1* | 8/2015 | Sutardja | H01L 24/96 257/675 |
| 2015/0279431 A1* | 10/2015 | Li | H01L 25/50 365/51 |
| 2017/0309600 A1* | 10/2017 | Jung | H01L 25/071 |
| 2018/0324951 A1* | 11/2018 | Goh | H01L 25/105 |

* cited by examiner

710
COUPLING A FIRST DIE TO A FIRST MOUNTING SURFACE OF A FIRST SUBSTRATE, WHEREIN THE FIRST MOUNTING SURFACE INCLUDES A FIRST INTERCONNECT REGION LATERALLY SPACED FROM THE FIRST DIE;

720
INTERCONNECTING THE FIRST INTERCONNECT REGION WITH A SECOND INTERCONNECT REGION, WHEREIN THE SECOND INTERCONNECT REGION IS INCLUDED IN A SECOND MOUNTING SURFACE OF A SECOND SUBSTRATE AND A SECOND DIE IS COUPLED TO THE SECOND MOUNTING SURFACE; AND
WHEREIN INTERCONNECTING THE FIRST INTERCONNECT REGION WITH THE SECOND INTERCONNECT REGION ESTABLISHES ONE OR MORE ELECTRICAL COMMUNICATION PATHWAYS BETWEEN THE FIRST SUBSTRATE AND THE SECOND SUBSTRATE.

*Fig. 7*

ELECTRONIC DEVICE PACKAGING

PRIORITY

This application claims the benefit of priority to Malaysian Application Serial Number PI 2017703699, filed Sep. 29, 2017, which is incorporated herein by reference in its entirety.

BACKGROUND

Electronic devices and systems may include a motherboard. The motherboard may be configured to mate with components and facilitate the communication of the components. In an example, the motherboard may be configured to route signals from a first electronic device (e.g., memory) to a second electronic device (e.g., a processor).

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Aspect 1 may include or use subject matter (such as an apparatus, a system, a device, a method, a means for performing acts, or a device readable medium including instructions that, when performed by the device, may cause the device to perform acts), such as may include or use an electronic device. The electronic device may include a substrate. The substrate may include a first mounting surface. The electronic device may include a first memory die. The first memory die may be coupled to the mounting surface. The electronic device may include an interconnect region. The interconnect region may be laterally spaced from the first memory die. The interconnect region may include one or more pads. The one or more pads may be coupled to the mounting surface. The electronic device may include one or more traces. The one or more traces may be configured to establish one or more electrical communication pathways between the first memory die and the one or more pads of the interconnect region.

Aspect 2 may include or use, or may optionally be combined with the subject matter of Aspect 1, to optionally include or use that the substrate may extend away from the first memory die.

Aspect 3 may include or use, or may optionally be combined with the subject matter of one or any combination of Aspects 1 or 2 to optionally include or use that the interconnect region may be offset from the first memory die.

Aspect 4 may include or use, or may optionally be combined with the subject matter of one or any combination of Aspects 1 through 3 to optionally include or use that the electronic device may be asymmetrically configured. The electronic device may be asymmetrically configured such that the interconnect region is positioned within a first segment of the mounting surface. The electronic device may be asymmetrically configured such that the first memory die is positioned within a second segment of the mounting surface.

Aspect 5 may include or use, or may optionally be combined with the subject matter of one or any combination of Aspects 1 through 4 to optionally include or use that the first memory die may be wirebonded to the substrate.

Aspect 6 may include or use, or may optionally be combined with the subject matter of one or any combination of Aspects 1 through 5 to optionally include or use that the interconnect region may include at least one hundred pads.

Aspect 7 may include or use, or may optionally be combined with the subject matter of one or any combination of Aspects 1 through 6 to optionally include or use a molding material. The molding material may encapsulate the first memory die.

Aspect 8 may include or use, or may optionally be combined with the subject matter of one or any combination of Aspects 1 through 7 to optionally include or use that a memory die stack. The memory die stack may include the first memory die.

Aspect 9 may include or use subject matter (such as an apparatus, a system, a device, a method, a means for performing acts, or a device readable medium including instructions that, when performed by the device, may cause the device to perform acts), such as may include or use an electronic system. The electronic system may include a first package. The first package may include a first substrate. The first substrate may include a first mounting surface. The first package may include a first die. The first die may be coupled to the first mounting surface. The first package may include a first interconnect region. The first interconnect region may be laterally spaced from the first die. The first interconnect region may include one or more pads. The one or more pads may be coupled to the first mounting surface. The first package may include one or more traces. The one or more traces may be configured to establish one or more electrical communication pathways between the first die the one or more pads of the first interconnect region.

The electronic system may include a second package. The second package may include a second substrate. The second substrate may include a second mounting surface. The second package may include a second die. The second die may be coupled to the second mounting surface. The second package may include a second interconnect region. The second interconnect region may be laterally spaced from the second die. The interconnect region may include one or more pads. The one or more pads may be coupled to the second mounting surface. The second package may include one or more traces. The one or more traces may be configured to establish one or more electrical communication pathways between the second die and the one or more pads of the second interconnect region. The electronic system may include that the one or more pads of the first interconnection region may be interconnected with the one or more pads of the second interconnection region. The interconnection may establish one or more electrical communication pathways between the first package and the second package.

Aspect 10 may include or use, or may optionally be combined with the subject matter of Aspect 9, to optionally include or use that the first die and the second die may be in electrical communication only through one or more electrical communication pathways that may be established between the first package and the second package.

Aspect 11 may include or use, or may optionally be combined with the subject matter of one or any combination of Aspects 9 or 10 to optionally include or use that only a portion of the first substrate overlaps a portion of the second substrate.

Aspect 12 may include or use, or may optionally be combined with the subject matter of one or any combination of Aspects 9 through 11 to optionally include or use that the first die may be laterally spaced from the second package.

Aspect 13 may include or use, or may optionally be combined with the subject matter of one or any combination of Aspects 9 through 12 to optionally include or use a motherboard. The motherboard may include a first surface. The first package and the second package may be positioned on the first surface.

Aspect 14 may include or use, or may optionally be combined with the subject matter of one or any combination of Aspect 13 to optionally include or use a molding material. The molding material may encapsulate the first die. The electronic system may include a spacer. The spacer may be positioned between the molding material and the first surface.

Aspect 15 may include or use, or may optionally be combined with the subject matter of one or any combination of Aspects 13 or 14 to optionally include or use that a portion of the first die and a portion of the second substrate may be positioned between the first substrate and the motherboard.

Aspect 16 may include or use, or may optionally be combined with the subject matter of one or any combination of Aspects 9 through 15 to optionally include or use that the first die may be a memory die.

Aspect 17 may include or use, or may optionally be combined with the subject matter of one or any combination of Aspects 9 through 16 to optionally include or use a die stack. The die stack may include the first die.

Aspect 18 may include or use, or may optionally be combined with the subject matter of one or any combination of Aspects 9 through 17 to optionally include or use that the second die may include a processor.

Aspect 19 may include or use subject matter (such as an apparatus, a system, a device, a method, a means for performing acts, or a device readable medium including instructions that, when performed by the device, may cause the device to perform acts), such as may include or use a method for manufacturing an electronic system. The method may include coupling a first die to a first mounting surface of a first substrate. The first mounting surface may include a first interconnect region. The first interconnect region may be laterally spaced from the first die. The method may include interconnecting the first interconnect region with a second interconnect region. The second interconnect region may be included in a second mounting surface of a second substrate. A second die may be coupled to the second mounting surface. The method may include that interconnecting the first interconnect region with the second interconnect region may establishes one or more electrical communication pathways between the first substrate and the second substrate.

Aspect 20 may include or use, or may optionally be combined with the subject matter of Aspect 19, to optionally include or use positioning the first mounting surface proximate the second mounting surface such that the first mounting surface faces the second mounting surface.

Aspect 21 may include or use, or may optionally be combined with the subject matter of one or any combination of Aspect 20 to optionally include or use that positioning the first mounting surface proximate the second mounting surface may include positioning the first die horizontally adjacent to the second substrate.

Aspect 22 may include or use, or may optionally be combined with the subject matter of one or any combination of Aspects 19 through 21 to optionally include or use interconnecting the second substrate with a motherboard.

Aspect 23 may include or use, or may optionally be combined with the subject matter of one or any combination of Aspects 19 through 22 to optionally include or use positioning the second substrate and the first die between the first substrate and the motherboard.

Aspect 24 may include or use, or may optionally be combined with the subject matter of one or any combination of Aspects 19 through 23 to optionally include or use that first die and the second die may be in electrical communication only through the one or more electrical communication pathways.

Aspect 25 may include or use, or may optionally be combined with the subject matter of one or any combination of Aspects 19 through 24 to optionally include or use that the first die may be a memory die. The second die may include a processor.

Each of these non-limiting examples may stand on its own, or may be combined in various permutations or combinations with one or more of the other examples.

This overview is intended to provide an overview of subject matter of the present patent application. It is not intended to provide an exclusive or exhaustive explanation of the invention.

Figure 1:
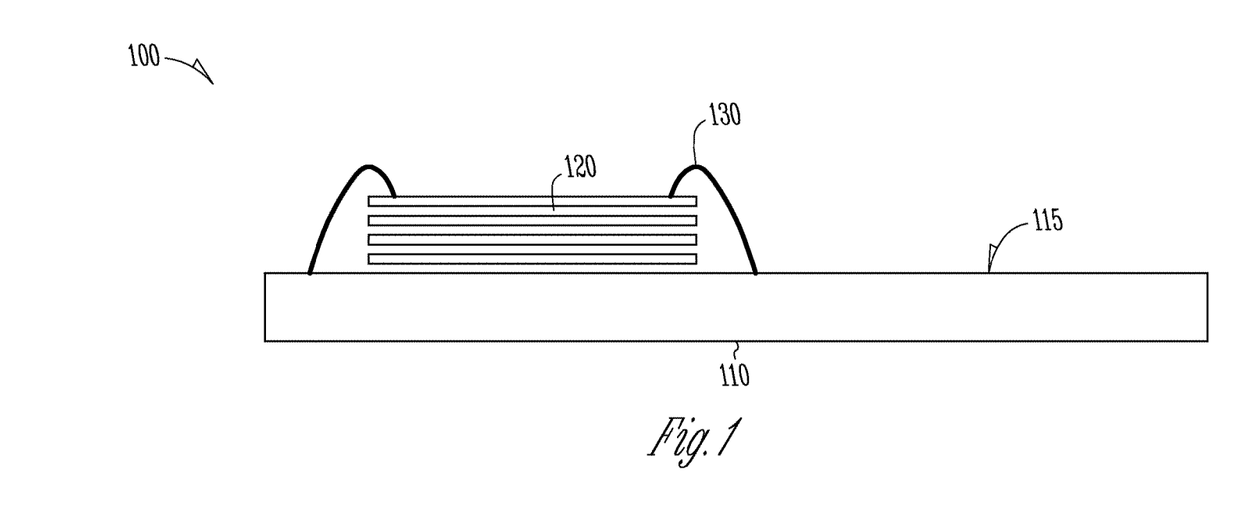
FIG. 1 illustrates a portion of a first electronic device, according to an example of the present subject matter.

FIG. 1 illustrates a portion of a first electronic device 100, according to an example of the present subject matter. The first electronic device 100 may also be referred to as a first package 100. The first electronic device 100 may include a substrate 110. The substrate 110 may also be referred to as a first substrate 110. The substrate 110 may include a mounting surface 115. The mounting surface 115 may also be referred to as a first mounting surface 115. The first electronic device 100 may include a die 120. The die 120 may also be referred to as a first die 120. The die 120 may be include in a plurality of die. The die 120 may be included in a die stack. The die 120 may be a memory die. The die 120 may be coupled to the mounting surface 115. The die 120 may be in electrical communication with the substrate 110, such as through the use of a wirebond 130.

Figure 2:
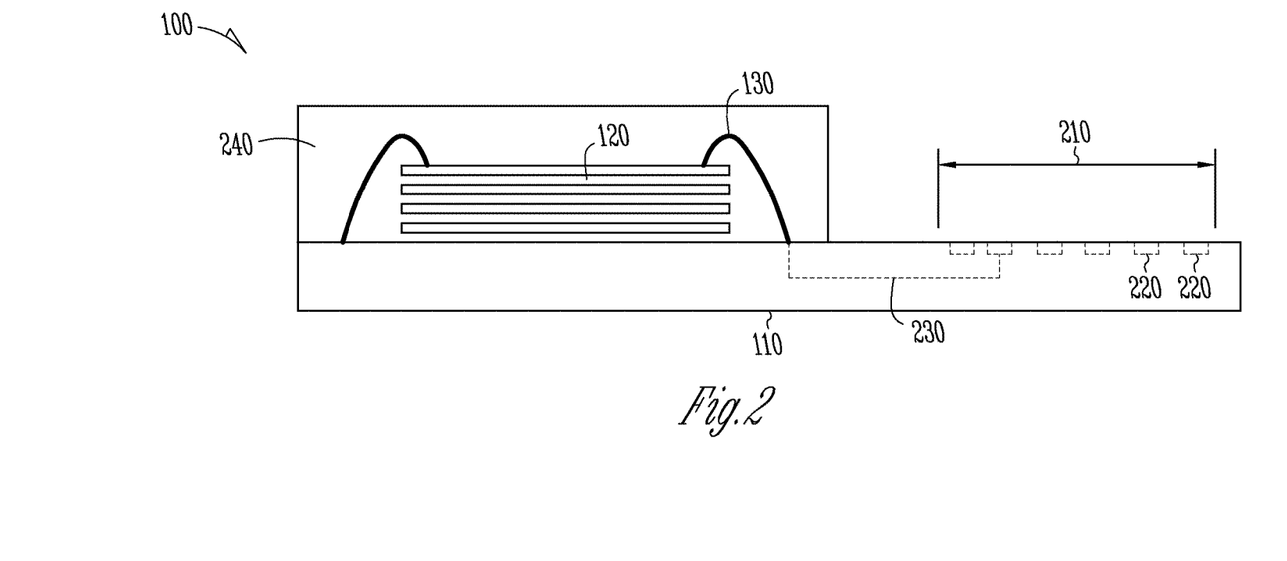
FIG. 2 illustrates another portion of the first electronic device, according to an example of the present subject matter.

FIG. 2 illustrates another portion of the first electronic device 100, according to an example of the present subject matter. The first electronic device 100 may include an interconnect region 210. The first electronic device 100 may include one or more pads 220. The first electronic device 100 may include one or more traces 230. The first electronic device 100 may include a molding material 240. The molding material 240 may encapsulate the die 120. The molding material 240 may encapsulate the plurality of dies or the die stack described with reference to FIG. 1. The molding material 240 may encapsulate the wirebond 130.

The one or more traces 230 may be configured to establish one or more electrical communication pathways between the die 120 and the one or more pads 220. The one or more traces 230 may be configured to establish one or more electrical communication pathways between additional die and the one or more pads 220.

The interconnect region 210 may include the one or more pads 220. The interconnect region 210 may include at least one hundred pads. The one or more pads 220 may be included in (e.g., coupled to or otherwise incorporated into) the mounting surface 115. The first electronic device 100 may be configured such that the first electronic device 100 may include interconnects (such as the one or more pads 220) only within the first interconnect region 210. The mounting surface 115 may be configured such that the mounting surface 115 includes interconnects (such as the one or more pads 220) only within the first interconnect region 210. In an example, the first die 120 may have a footprint corresponding to an area that the first die 120 occupies of the mounting surface 115. The first electronic device 100 may be configured such that interconnects are only provided within the footprint of the first die 120 and the first interconnect region 210. Stated another way, aside from the interconnects provided for the first die 120, interconnects may only be found on the mounting surface 115 within the first interconnect region 210.

Figure 3:
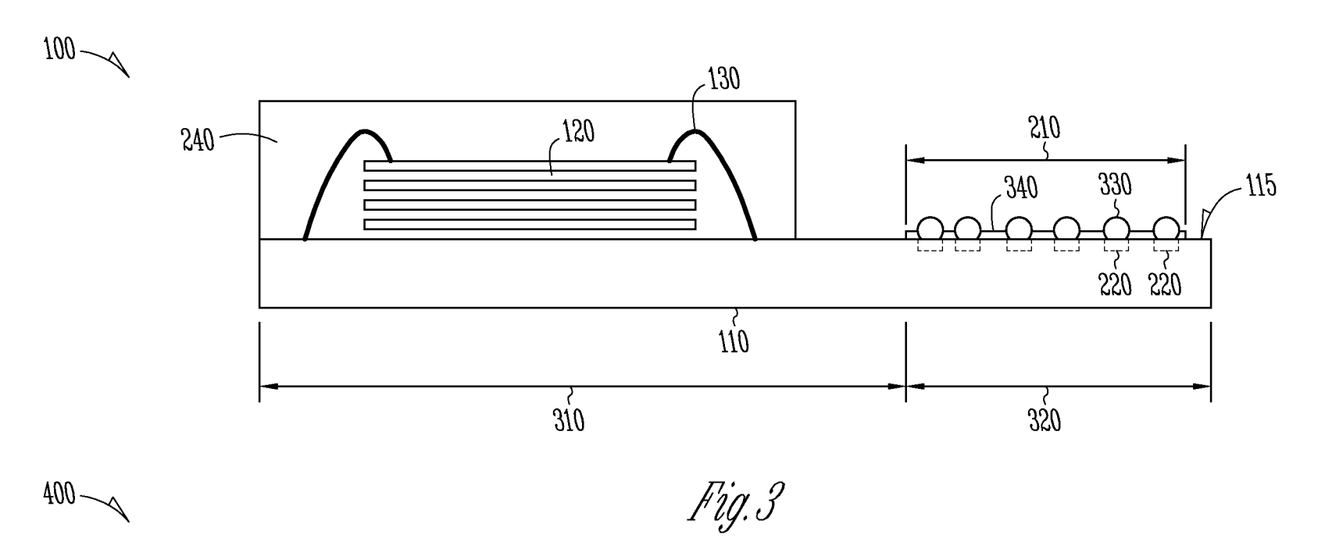
FIG. 3 illustrates yet another portion of the first electronic device, according to an example of the present subject matter.

FIG. 3 illustrates yet another portion of the first electronic device 100, according to an example of the present subject matter. The substrate 110 may extend away from the die 120. The interconnect region 210 may be laterally spaced (e.g., offset) from the die 110. Stated another way, the interconnect region 210 may be positioned at a first distance from the die 110. The interconnect region 210 may be positioned at a second distance from the molding material 240. A gap may exist between the interconnect region 210 and the molding material 240.

The first electronic device 100 may be asymmetrically configured. The first electronic device 100 may be asymmetrically configured such that the die 120 is positioned within a first segment 310 of the mounting surface 115. The first electronic device 100 may be asymmetrically configured such that the interconnect region 210 is positioned within a second segment 320 of the mounting surface 115.

A solder ball 330 may be coupled to each of individual pads of the one or more pads 220. A flux material 340 may be used to assist in the coupling of the solder ball 330 to the individual pads of the one or more pads 220. The flux material 340 may clean the coupling surface of the one or more pads 220 to remove surface contaminants, such as by removing oxidation. The solder ball 330 may be in electrical communication with the die 120. The solder ball 330 may be utilized to interconnect the one or more pads 220 with other structures.

Figure 4:
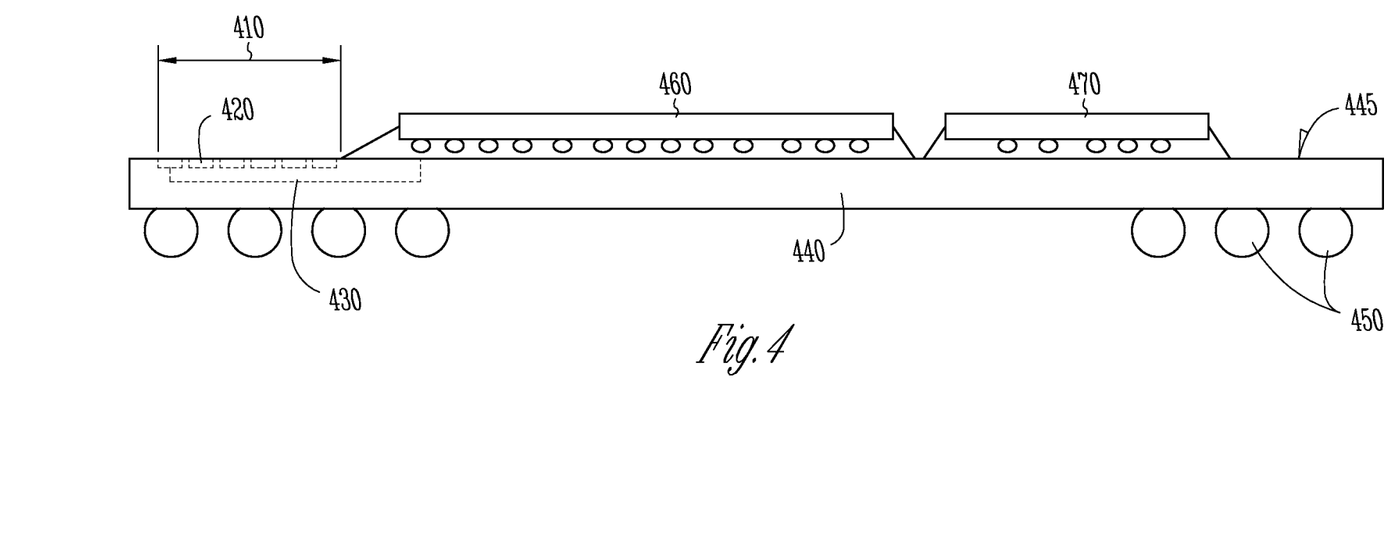
FIG. 4 illustrates a portion of a second electronic device, according to an example of the present subject matter.

FIG. 4 illustrates a portion of a second electronic device 400, according to an example of the present subject matter. The second electronic device 400 may also be referred to as a second package 400. The second electronic device 400 may include a second interconnect region 410, one or more pads 420, one or more traces 430, a second substrate 440, a second mounting surface 445, solder bumps 450, a second die 460. The second electronic device 400 may include a third die 460. The second die 460, or the third die 470, may include (or be included in) a processor. The one or more traces 430 may allow for the electrical communication between the second die 460 and the one or more pads 420. The one or more traces 430 may allow for the electrical communication between the third die 470 and the one or more pads 420. The second interconnect region 410 may be configured to couple with the first interconnect region 210 of FIG. 2. The configuration of the one or more pads 420 of the second interconnect region 410 may be configured to match the configuration of the one or more pads 220 of the first interconnect region 210. The one or more pads 220 of the first interconnect region 210 and the one or more pads 420 of the second interconnect region 410 may be arranged in an array (e.g., a ball grid array).

The second substrate 440 may extend away from second die 460 and/or the third die 470. The second electronic device 400 may be asymmetrically configured. The second electronic device 400 may be asymmetrically configured such that the second interconnect region 410 is positioned within a first segment of the second mounting surface 445. The second electronic device 400 may be asymmetrically configured such that the second die 460 is positioned within a second segment of the second mounting surface 445. The second electronic device 400 may be asymmetrically configured such that the third die 470 is positioned within a third segment of the second mounting surface 445.

The second interconnect region 410 may include the one or more pads 420. The second mounting surface 445 may include interconnects (e.g., the one or more pads 420) only within the second interconnect region 410. In an example, the second mounting surface 445 includes the interconnect region 410, the second die 460, and the third die 470. The second die 460 and the third die 470 may each have a footprint corresponding to the area that the second die 460 and the area that the third die 470 each occupy of the second mounting surface 445.

The second electronic device 400 may be configured such that interconnects are only provided within the footprint of the second die 460, the footprint of the third die 470, and the second interconnect region 410. Stated another way, aside from the interconnects provided for the second die 460 and the third die 470, interconnects may only be found on the second mounting surface 445 within the second interconnect region 410. However, the second electronic device 400 may include additional interconnect regions (e.g., a third interconnect region, a fourth interconnect region, or a fifth interconnect region). The additional interconnect regions may be configured to allow the interconnection of a plurality of first electronic devices 100 with the second electronic device 400.

Figure 5:
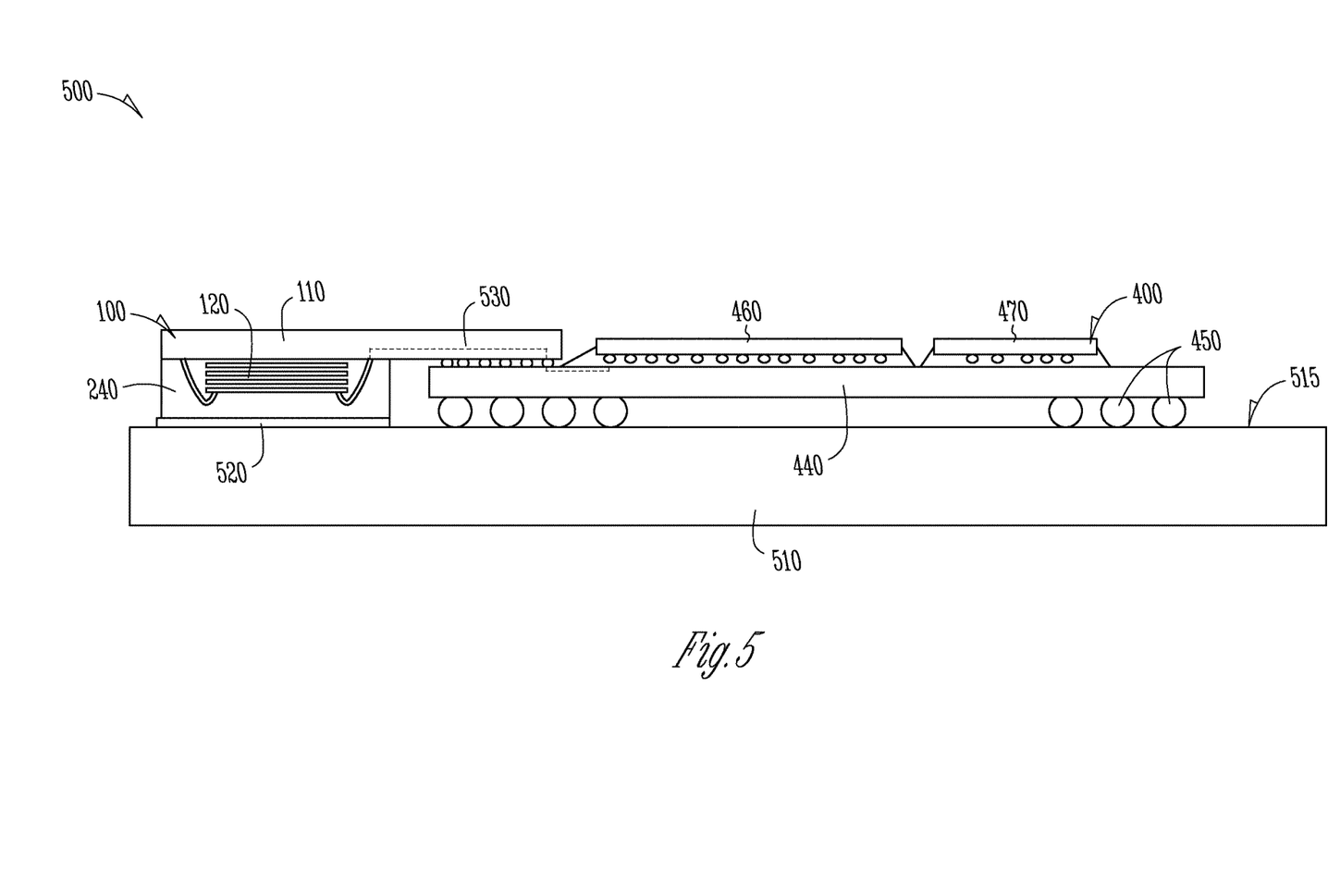
FIG. 5 illustrates a portion of a first electronic system, according to an example of the present subject matter.

FIG. 5 illustrates a portion of a first electronic system 500, according to an example of the present subject matter. The first electronic system 500 may include the first electronic device 100. The first electronic system 500 may include the second electronic device 400. The first electronic system 500 may include a third substrate. The third substrate may be a motherboard 510. The motherboard 510 may include a first surface 515. The first electronic device 100 may be positioned on the first surface 515. The second electronic device 400 may be positioned on the first surface 515. The motherboard 510 may be configured to route signals from the first die 120, the second die 460, and the third die 470 to other system components (e.g., a touch screen or other components described herein). The solder bumps 450 may facilitate the electrical communication of the first die 120, the second die 460, and the third die 470 with the other system components The first electronic device 100 may be configured to couple with the second electronic device 400. As described herein, the second interconnect region 410 (shown in FIG. 4) may be configured to couple (or interconnect) with the first interconnect region 210 (shown in FIG. 2). Interconnecting first electronic device 100 with the second electronic device may interconnect the one or more pads 220 of the first interconnect region 210 (shown in FIG. 2) with the one or more pads 420 of the second interconnect region 410 (shown in FIG. 4). Interconnecting the one or more pads 220 of the first interconnection region 210 with the one or more pads 420 of the second interconnection region 210 may establish one or more electrical communication pathways 530 between the first electronic device 100 and the second electronic device 400.

The first die 120 and the second die 460 may be in electrical communication only through one or more electrical communication pathways 530 between the first electronic device 100 and the second electronic device 400. The first die 120 and the third die 470 may be in electrical communication only through one or more electrical communication pathways 530 between the first electronic device 100 and the second electronic device 400. Stated another way, by interconnecting the first electronic device 100 with the second electronic device 400, the motherboard 510 may not be needed to facilitate the electrical communication between the first die 120 and the second die 460 or the third die 470.

As shown in FIG. 5, in some instances, only a portion of the first substrate 110 may overlap a portion of the second substrate 440. In an example, only the first interconnect region 210 may overlap (or intersect) the second interconnect region 410. A portion of the first die 120 and a portion of the second substrate 440 may be positioned between the first substrate 110 and the motherboard 510.

The first electronic system 500 may be configured such that the first die 120 is laterally spaced (e.g., spaced apart in a horizontal direction with reference to the page) from the second electronic device 400. Laterally spacing the first die 120 may include spacing the first die 120 in a horizontal (e.g., in a direction parallel with the first surface 515) distance from the second electronic device 400. Laterally spacing the first die 120 may include positioning the first die 120 at the side of (e.g., horizontally adjacent to) the second electronic device 400 such that a portion of the first die 120 is not on top of (e.g., overlapping in a direction normal to the first surface 515) the second electronic device 400. Laterally spacing the first die 120 may include positioning the first die 120 and the second substrate 440 in the same plane. Laterally spacing the first die 120 may include positioning the molding material 240 in the same plane as the second substrate 440.

The first electronic system 500 may include the plurality of first electronic devices 100. In an example, the first electronic system 500 may include a pair of (e.g., two) first electronic devices 100 interconnected with the second electronic device 400. The pair of first electronic devices 100 may each include memory with 32 bit architecture. Interconnecting the pair of first electronic devices 100 may provide a 64 bit memory channel. In an example, the pair of first electronic devices 100 may each include memory with 64 bit architecture. Interconnecting the pair of first electronic devices 100 may provide two 64 bit memory channels. In an example, the first electronic system 500 may include two pairs (e.g., four) of first electronic devices 100 interconnected with the second electronic device 400. The two pairs of first electronic devices 100 may all include memory with 32 bit architecture. Interconnecting the two pairs of first electronic devices 100 may provide two 64 bit memory channels. The pair (or pairs) of first electronic devices 100 may be configured similar to an individual first electronic device 100, in relation to the second electronic device 400 (e.g., overlapping, laterally spacing, or the like).

A spacer 520 may be included in the first electronic system 500. The spacer 520 may be positioned between the molding material 240 and the first surface 515.

The spacer 520 may provide a proper offset between the first electronic device 100 and the motherboard 510 such that the first interconnect region 210 is able to couple with the second interconnect region 410. An adhesive may be used to couple the spacer 520 to the molding material 240 or the first surface 515. A thermal interface material may be applied to the molding material 240, the spacer 520, and/or the first surface 515 to improve heat dissipation from the first electronic device 100.

The configurations of the first electronic system 500 may allow for a smaller overall package size for the electronic components as compared to conventional configurations (e.g., package on package). The configurations of the first electronic system 500 may reduce the size of the second electronic device 400, such as by removing the need for the second electronic device 400 to receive signals from the first die 120 through the motherboard 510.

The configurations of the first electronic system 500 may reduce the size of the motherboard 510 by eliminating the need of the motherboard 510 to be configured to route signals between the first die 120 and the second die 460 (or the third die 470). The configurations of the first electronic system 500 may reduce the complexity of the motherboard 510, such as by reducing the number of layers and signal routing structures required for the motherboard 510 to function. The configurations of the first electronic system 500 may reduce the complexity of the motherboard 510 by removing the amount of signal routing demanded from the motherboard 510. In an example, eliminating the need for the motherboard 510 to facilitate the electrical communication between the first die 120 and the second die 460 or the third die 470 may reduce the size or complexity of the motherboard 510, thereby reducing costs and simplifying manufacturing of the first electronic system 500.

The configurations of the first electronic system 500 may improve (or extend the life (e.g., amount of charge) of a battery coupled to the first electronic system 500, such as by reducing the amount of electrical losses due to reducing signal routing distances and junctions. The configurations of the first electronic system 500 may improve signal quality between the first die 120 and the second die 460 (or the third die 470), such as by reducing the amount of electrical losses/interference due to reducing signal routing distances and junctions.

Figure 6:
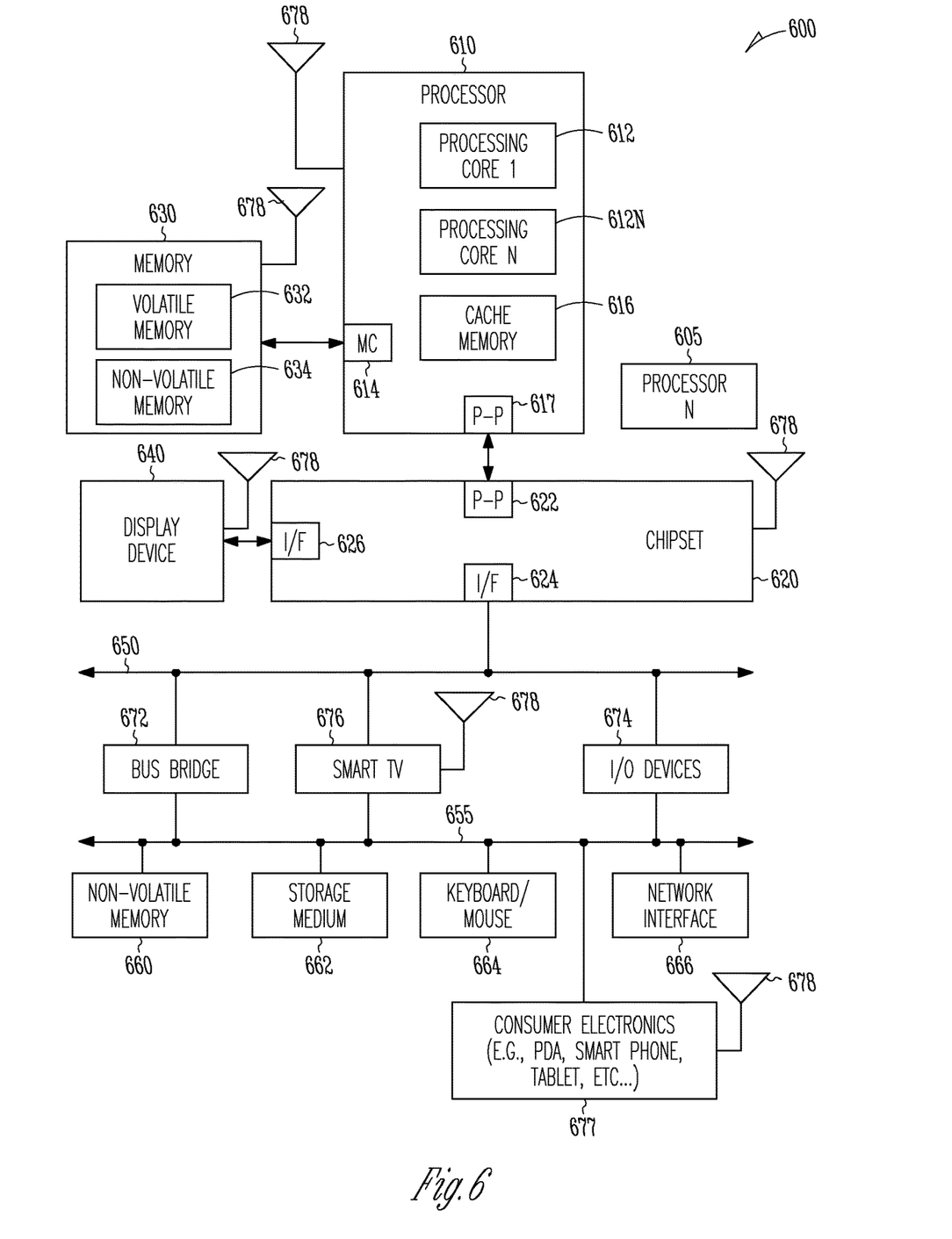
FIG. 6 illustrates a system level diagram, depicting an example of an electronic device (e.g., system) including the first electronic device and the second electronic device as described in the present disclosure.

FIG. 6 illustrates a system level diagram, depicting an example of an electronic device (e.g., second electronic system 600) that may include the first electronic device 100 and the second electronic device 400 as described in the present disclosure. FIG. 6 is included to show an example of a higher level device application for the first electronic device 100, the second electronic device 400, and/or the first electronic system 500. In one embodiment, second electronic system 600 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, second electronic system 600 is a system on a chip (SOC) system.

In one embodiment, processor 610 has one or more processor cores 612 and 612N, where 612N represents the Nth processor core inside processor 610 where N is a positive integer. The processor 610 may include the second die 460. In one embodiment, second electronic system 600 includes multiple processors including 610 and 605, where processor 605 has logic similar or identical to the logic of processor 610. The processor 605 may include the third die 470. In some embodiments, processing core 612 includes, but is not limited to, pre-fetch logic to fetch instructions, decode logic to decode the instructions, execution logic to execute instructions and the like. In some embodiments, processor 610 has a cache memory 616 to cache instructions and/or data for second electronic system 600. Cache memory 616 may be organized into a hierarchal structure including one or more levels of cache memory.

In some embodiments, processor 610 includes a memory controller 614, which is operable to perform functions that enable the processor 610 to access and communicate with memory 630 that includes a volatile memory 632 and/or a non-volatile memory 634. In some embodiments, processor 610 is coupled with memory 630 and chipset 620. Processor 610 may also be coupled to a wireless antenna 678 to communicate with any device configured to transmit and/or receive wireless signals. In one embodiment, an interface for wireless antenna 678 operates in accordance with, but is not limited to, the IEEE 802.11 standard and its related family, Home Plug AV (HPAV), Ultra Wide Band (UWB), Bluetooth, WiMax, or any form of wireless communication protocol.

In some embodiments, volatile memory 632 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 634 includes, but is not limited to, flash memory, phase change memory (PCM), read-only memory (ROM), electrically erasable programmable read-only memory (EEPROM), or any other type of non-volatile memory device.

Memory 630 stores information and instructions to be executed by processor 610. The memory 630 may include the first die 120. In one embodiment, memory 630 may also store temporary variables or other intermediate information while processor 610 is executing instructions. In the illustrated embodiment, chipset 620 connects with processor 610 via Point-to-Point (PtP or P-P) interfaces 617 and 622. Chipset 620 enables processor 610 to connect to other elements in second electronic system 600. In some embodiments of the example system, interfaces 617 and 622 operate in accordance with a PtP communication protocol such as the Intel® QuickPath Interconnect (QPI) or the like. In other embodiments, a different interconnect may be used.

In some embodiments, chipset 620 is operable to communicate with processor 610, 605N, display device 640, and other devices, including a bus bridge 672, a smart TV 676, I/O devices 674, nonvolatile memory 660, a storage medium (such as one or more mass storage devices) 662, a keyboard/mouse 664, a network interface 666, and various forms of consumer electronics 677 (such as a PDA, smart phone, tablet etc.), etc. In one embodiment, chipset 620 couples with these devices through an interface 624. Chipset 620 may also be coupled to a wireless antenna 678 to communicate with any device configured to transmit and/or receive wireless signals. The chipset 620 may include the third die 470.

Chipset 620 connects to display device 640 via interface 626. Display 640 may be, for example, a liquid crystal display (LCD), a plasma display, cathode ray tube (CRT) display, or any other form of visual display device. In some embodiments of the example system, processor 610 and chipset 620 are merged into a single SOC. In addition, chipset 620 connects to one or more buses 650 and 655 that interconnect various system elements, such as I/O devices 674, nonvolatile memory 660, storage medium 662, a keyboard/mouse 664, and network interface 666. Buses 650 and 655 may be interconnected together via a bus bridge 672.

In one embodiment, mass storage device 662 includes, but is not limited to, a solid state drive, a hard disk drive, a universal serial bus flash memory drive, or any other form of computer data storage medium. In one embodiment, network interface 666 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 6 are depicted as separate blocks within the second electronic system 600, the functions performed by some of these blocks may be integrated within a single semiconductor circuit or may be implemented using two or more separate integrated circuits. For example, although cache memory 616 is depicted as a separate block within processor 610, cache memory 616 (or selected aspects of 616) may be incorporated into processor core 612.

Figure 7:
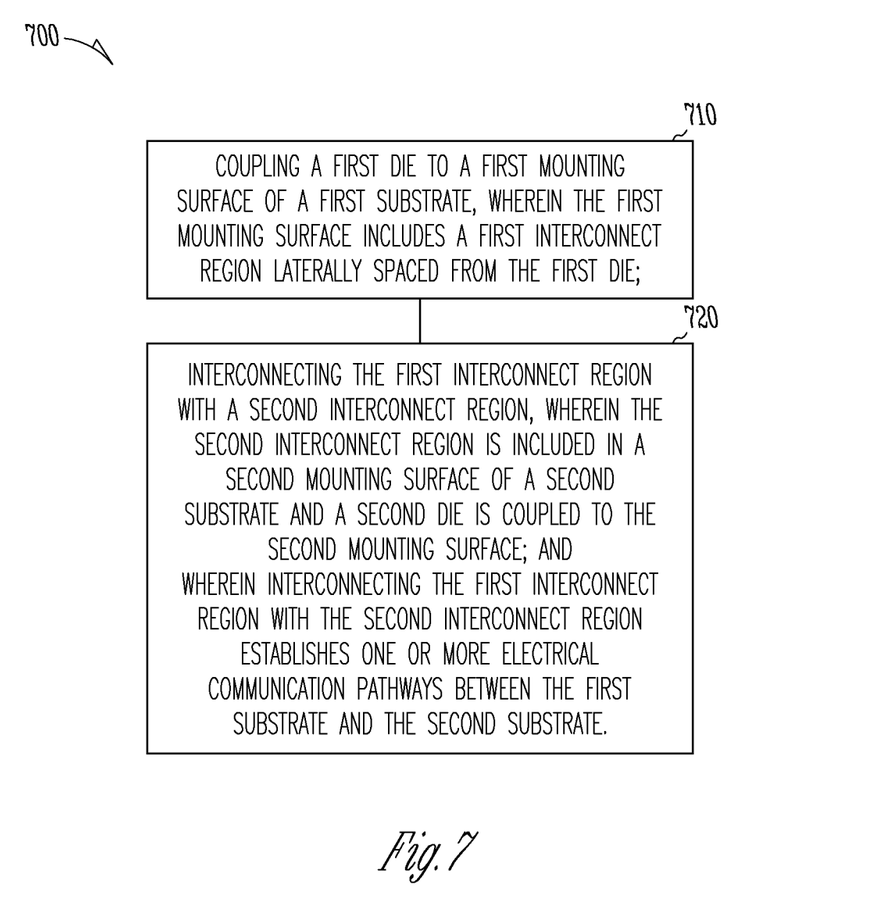
FIG. 7 illustrates a method for manufacturing an electronic system, according to an example of the present subject matter.

FIG. 7 illustrates a method 700 for manufacturing an electronic system (e.g., the first electronic system of FIG. 5 or the second electronic system 600 of FIG. 6), according to an example of the present subject matter. The method 700 may include at operation 710 coupling a first die (e.g., the first die 120 of FIGS. 1-3 and 5) to a first mounting surface (e.g., the first mounting surface 115 of FIG. 1) of a first substrate. The first mounting surface may include a first interconnect region (e.g., the first interconnect region 210 of FIGS. 2-3) laterally spaced from the first die.

The method 700 may include at operation 720 interconnecting the first interconnect region with a second interconnect region (e.g., the second interconnect region 410 of FIG. 4). The second interconnect region may be included in a second mounting surface (e.g., the second mounting surface 445 of FIG. 4) of a second substrate. A second die (e.g., the second die 460 or the third die 470 of FIG. 4) may be coupled to the second mounting surface.

The method 700 may include that interconnecting the first interconnect region with the second interconnect region may establish one or more electrical communication pathways between the first substrate and the second substrate. The method 700 may include that the first die and the second die are in electrical communication only through the one or more electrical communication pathways.

The method 700 may include positioning the first mounting surface proximate the second mounting surface such that the first mounting surface faces the second mounting surface. The method 700 may include that positioning the first mounting surface proximate the second mounting surface includes positioning the first die horizontally adjacent to the second substrate.

The method 700 may include interconnecting the second substrate with a motherboard. The method 700 may include positioning the second substrate and the first die between the first substrate and the motherboard. The first die may be a memory die. The second die may include a processor.

Various Notes

The above description includes references to the accompanying drawings, which form a part of the detailed description. The drawings show, by way of illustration, specific embodiments in which the invention may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Geometric terms, such as "parallel", "perpendicular", "round", or "square", are not intended to require absolute mathematical precision, unless the context indicates otherwise. Instead, such geometric terms allow for variations due to manufacturing or equivalent functions. For example, if an element is described as "round" or "generally round," a component that is not precisely circular (e.g., one that is slightly oblong or is a many-sided polygon) is still encompassed by this description.

Method examples described herein may be machine or computer-implemented at least in part. Some examples may include a computer-readable medium or machine-readable medium encoded with instructions operable to configure an electronic device to perform methods as described in the above examples. An implementation of such methods may include code, such as microcode, assembly language code, a higher-level language code, or the like. Such code may include computer readable instructions for performing various methods. The code may form portions of computer program products. Further, in an example, the code may be tangibly stored on one or more volatile, non-transitory, or non-volatile tangible computer-readable media, such as during execution or at other times. Examples of these tangible computer-readable media may include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments may be combined with each other in various combinations or permutations. The scope of the invention should be determined with reference to the appended claims, along with the full scope of equivalents to which such claims are entitled.

The invention claimed is:

1. An electronic system, comprising:
 a first package, including:
  a first substrate having a first mounting surface,
  a first die coupled to the first mounting surface,
  a first interconnect region laterally spaced from the first die, wherein the first interconnect region includes one or more pads coupled to the first mounting surface,
  a first set of traces configured to establish one or more electrical communication pathways between the first die and the one or more pads of the first interconnect region, and
  a molding material encapsulating the first die, wherein the molding material is coupled to the first mounting surface of the first substrate, and the first interconnect region is spaced apart from the molding material and the molding material encapsulating the first die does not encapsulate the first interconnect region;
 a second package, including:
  a second substrate having a second mounting surface,
  a second die coupled to the second mounting surface,
  a second interconnect region laterally spaced from the second die, wherein the second interconnect region includes one or more pads coupled to the second mounting surface, and
  a second set of traces configured to establish one or more electrical communication pathways between the second die and the one or more pads of the second interconnect region;
 a motherboard having a first motherboard surface, wherein:
  the first package and the second package are positioned on the first motherboard surface, and
  the molding material is adjacent the first motherboard surface;
 wherein the one or more pads of the first interconnection region are interconnected with the one or more pads of the second interconnection region and the interconnection establishes one or more electrical communication pathways between the first package and the second package; and
 wherein only a portion of the first substrate overlaps a portion of the second substrate and the first substrate includes a second surface opposite the first mounting surface, and the second surface does not include electrical interconnects.

2. The system of claim 1, wherein the first die and the second die are in electrical communication only through one or more electrical communication pathways between the first package and the second package.

3. The system of claim 1, wherein the first die is laterally spaced from the second package.

4. The system of claim 1, further comprising a spacer located between the molding material of the first package and the first motherboard surface.

5. The system of claim 1, wherein the molding material of the first package is coplanar with a portion of the second substrate.

6. The system of claim 1, further comprising a die stack, the die stack including the first die.

7. The system of claim 1, wherein the second die includes a processor.

8. A method for manufacturing an electronic system, comprising:
   coupling a first die to a first mounting surface of a first substrate, wherein the first mounting surface includes a first interconnect region laterally spaced from the first die, wherein a first set of traces establish one or more electrical communication pathways between the first die and the one or more pads of the first interconnect region;
   encapsulating the first die in a molding material, wherein the molding material is coupled to the first mounting surface of the first substrate, wherein the first interconnect region is spaced apart from the molding material and the molding material encapsulating the first die does not encapsulate the first interconnect region;
   interconnecting the first interconnect region with a second interconnect region, wherein the second interconnect region is included in a second mounting surface of a second substrate and a second die is coupled to the second mounting surface, wherein a second set of traces establish one or more electrical communication pathways between the second die and the one or more pads of the second interconnect region;
   interconnecting the second substrate with a motherboard;
   positioning the second substrate and the first die between the first substrate and the motherboard, wherein the molding material is adjacent a first surface of the motherboard;
   wherein interconnecting the first interconnect region with the second interconnect region establishes one or more electrical communication pathways between the first substrate and the second substrate; and
   wherein only a portion of the first substrate overlaps a portion of the second substrate and the first substrate includes a second surface opposite the first mounting surface, and the second surface does not include electrical interconnects.

9. The method of claim 8, further comprising positioning the first mounting surface proximate the second mounting surface such that the first mounting surface faces the second mounting surface.

10. The method of claim 9, wherein positioning the first mounting surface proximate the second mounting surface includes positioning the first die horizontally adjacent to the second substrate.

11. The method of claim 8, wherein first die and the second die are in electrical communication only through the one or more electrical communication pathways.

12. The method of claim 8, wherein the first die is a memory die and the second die includes a processor.

* * * * *